United States Patent [19]
Doi

[11] Patent Number: 6,140,809
[45] Date of Patent: Oct. 31, 2000

[54] SPECTRUM ANALYZER

[75] Inventor: Wataru Doi, Hanyu, Japan

[73] Assignee: Advantest Corporation, Tokyo, Japan

[21] Appl. No.: 08/903,413

[22] Filed: Jul. 30, 1997

[30]     Foreign Application Priority Data

Aug. 9, 1996   [JP]   Japan .................................. 8-211090

[51] Int. Cl.[7] .......................... H04N 17/00; G01R 13/14; G01R 23/00
[52] U.S. Cl. .................... 324/76.24; 324/76.24; 324/76.19; 348/180; 348/181; 348/190; 348/191; 455/67.1; 455/192.2; 455/263; 455/226.1; 342/20; 342/21
[58] Field of Search .................... 348/180, 181, 348/184, 185, 187, 188, 189, 190, 191, 192, 193; 324/76.19, 76.24; 455/67.1, 192.1, 192.2, 257, 263, 226.1; 342/20, 21

[56]             References Cited

U.S. PATENT DOCUMENTS

| 4,975,633 | 12/1990 | Toda et al. | 324/76.24 |
|---|---|---|---|
| 5,032,784 | 7/1991 | Smith | 324/77 |
| 5,493,209 | 2/1996 | Gumm et al. | 324/76.27 |
| 5,736,845 | 4/1998 | Kosuge | 324/76.27 |
| 5,869,959 | 2/1999 | Tomikawa | 324/76.27 |

OTHER PUBLICATIONS

*Wireless PCS Personal Communications Services*, Rajan Kuruppillai, Mahi Dontamsetti, Fil J. Cosentino, McGraw–Hill, 1997, (ISBN 0–07–036077–4), pp. v, viii, 236, and 237.

*Primary Examiner*—John K. Peng
*Assistant Examiner*—Paulos Natnael
*Attorney, Agent, or Firm*—Staas & Halsey LLP

[57]             ABSTRACT

A received signal is converted in a frequency converter, an output from which is again frequency converted. The second converted output is detected by a detector and then converted into a digital signal to be stored in a memory. A spectrum display is provided by a display. A frequency sweep of local signals supplied to frequency converter is enabled. While holding the frequency sweep for the earlier stage suspended to receive one of the radio waves in service, a signal to the input of the frequency converter may be branched and demodulated by demodulation means. A vertical sync signal is separated in monitor processing means and the frequency of the local signal generator may be swept only during a no-modulation interval contained in a vertical blanking interval, thus extracting a carrier component and a noise component, the levels of which are determined to provide a measure of C/N.

15 Claims, 4 Drawing Sheets

SPECTRUM ANALYZER

BACKGROUND OF THE INVENTION

1. Field of the Invention

The invention relates to a spectrum analyzer in which a frequency conversion takes place at at least two stages and which permits the frequencies of at least two such local signals to be changed and which also permits the frequency of a local signal of a later stage to be changed while holding the frequency sweep suspended for the local signal of an earlier stage.

2. Description of the Related Art

FIG. 1 shows an example of a general arrangement of a conventional spectrum analyzer of the kind described. An input signal is applied to an input terminal 14, and passes through an input variable attenuator 16 of a spectrum analyzer 15 to be fed to an earlier stage frequency converter 17 where it is mixed with a local signal from a frequency sweep oscillator 18. A resulting intermediate frequency signal is extracted by a bandpass filter 19, amplified by an amplifier 21 and then fed to a later stage frequency converter 22 where it is again mixed with a local signal from a local oscillator 23 to provide another intermediate frequency signal, which is then extracted by a bandpass filter 24 and detected by a detector 26. The detection output is passed through a low pass filter 27 and then converted into a digital signal by an A/D converter 28 to be stored in a buffer memory 29. A controller 31, which comprises a microprocessor including a CPU, sets up an attenuation in the attenuator 16 in accordance with a parameter to be measured which is entered by parameter presetting means 32, and also acts through a timing controller 33 to control a ramp voltage generator 34, thus establishing and controlling a sweep frequency band of the oscillator 18. The controller 31 also controls a display of data stored in the buffer memory 29 on a display 35.

As a consequence of this, the display 35 indicates how the status of frequency components in the input signal is, thus permitting an analysis in the frequency domain. When a desired frequency is entered, a frequency of the local signal which enables the extraction of the desired frequency component remains to be established by the ramp voltage generator 34, allowing the progress of the desired frequency component in the input signal with time to be displayed on the display 35 and thus permitting an analysis in the time domain.

In order to enhance the resolution of the frequency analysis, a ramp voltage is caused to be generated by a ramp voltage generator 39 through a timing controller 38 while the sweep of the frequency sweep generator 18 is held suspended, and the ramp voltage is used to sweep the oscillation frequency of the later stage frequency sweep generator 23. In the prior art, it has been impossible to perform an analysis in the frequency domain and an analysis in the time domain simultaneously. In particular, it has been impossible to detect a specific area in the time domain and to detect components in the frequency domain for that area.

SUMMARY OF THE INVENTION

In accordance with the invention, an output from an earlier stage frequency converter is branched at a point prior to a later stage frequency converter, and the branched signal is demodulated by demodulation means. A specific area can be detected from the demodulation output and an analysis in the frequency domain for that area is enabled.

DESCRIPTION OF THE PREFERRED EMBODIMENTS

Figure 1:
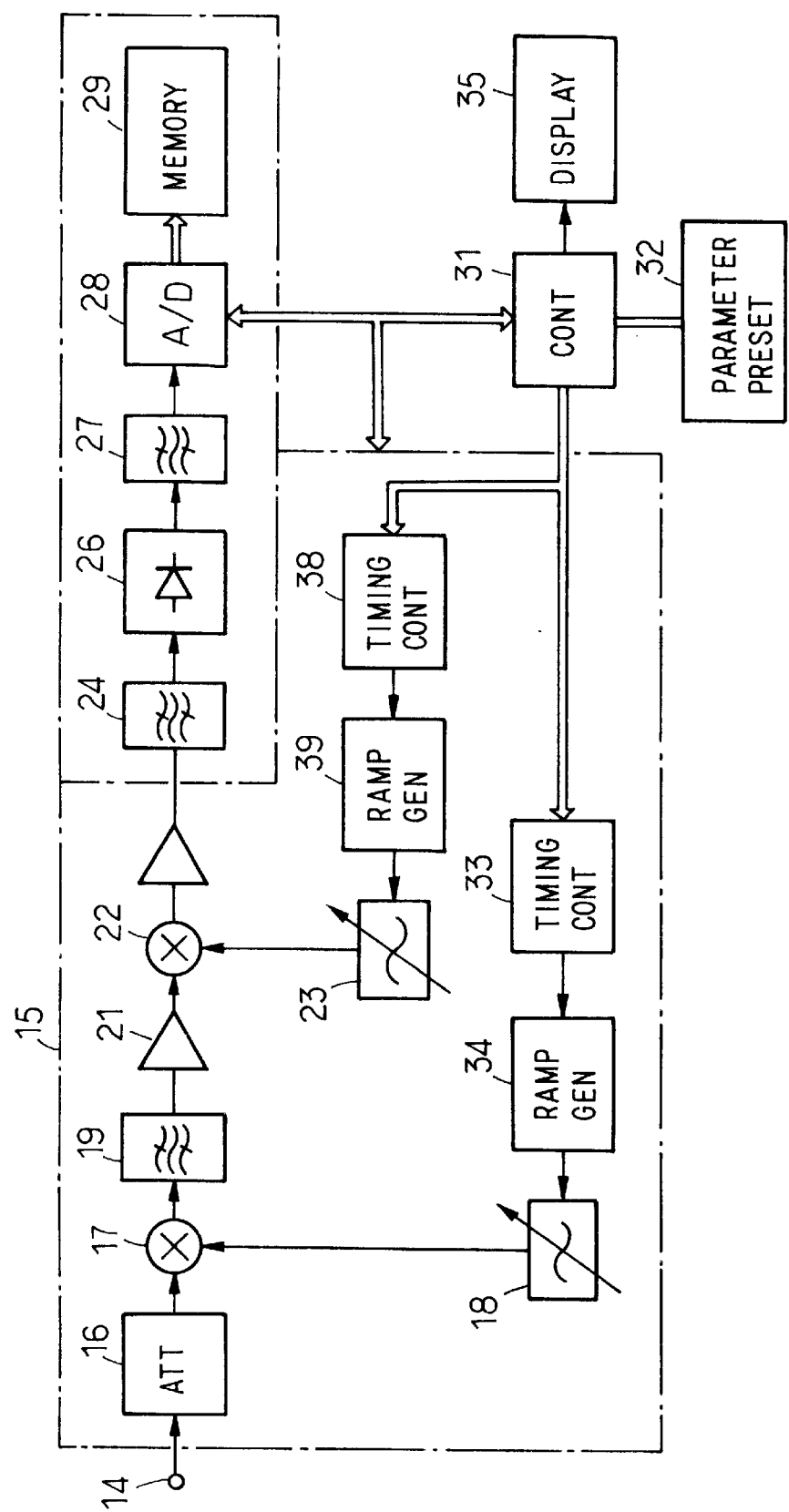
FIG. 1 is a block diagram of a conventional spectrum analyzer.
Figure 2:
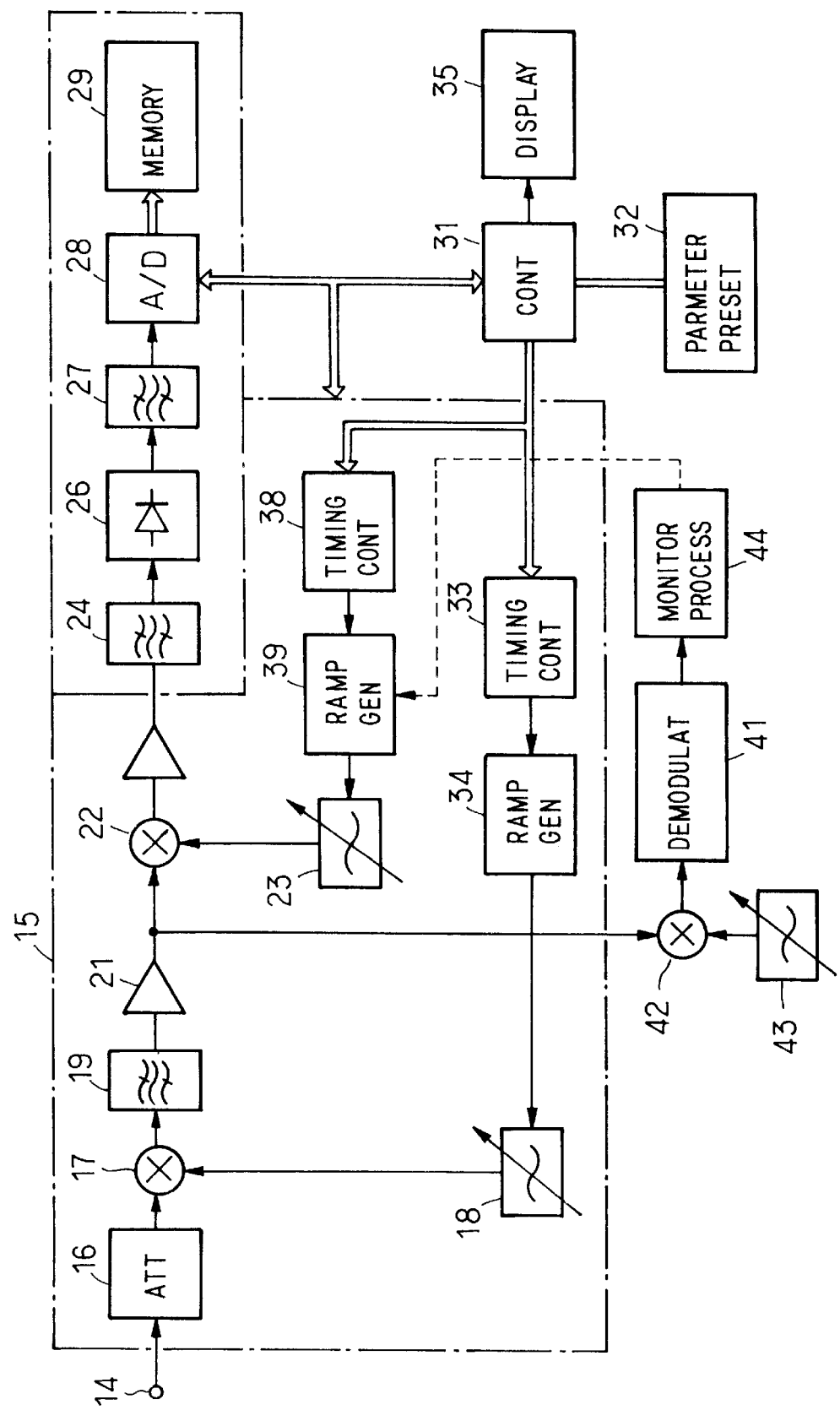
FIG. 2 is a block diagram of an embodiment of the invention.

FIG. 2 shows an embodiment of the invention, and in this Figure, parts corresponding to those shown in FIG. 1 are designated by like reference numerals as used before. In accordance with the invention, a signal which is to be input to the later stage frequency converter 22 is branched and fed to demodulation means 41. For the convenience of demodulation in the demodulation means 41, the branched signal may be subject to a frequency conversion in a frequency converter 42 using a local signal from a local oscillator 43 before it is fed to the demodulation means 41. Where the input signal at the input terminal 14 is a television broadcast signal, a television signal is demodulated or a speech signal thereof is extracted in the demodulation means 41. Where the input signal is an FM/AM broadcast signal, an audio signal is demodulated. Such a demodulated output is monitored either in auditory or visual manner by monitor processing means 44, or alternatively, a specific signal area is extracted and used to conduct a spectral analysis thereon.

Figure 3A:
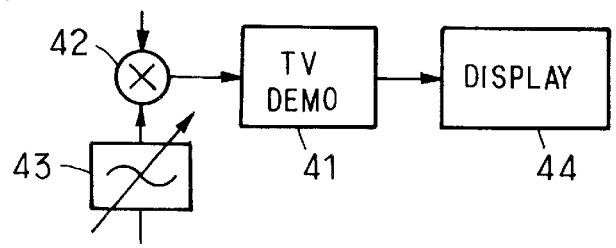
FIGS. 3A to 3D are block diagrams illustrating part of other embodiments.

The frequency sweep of the local signal fed to the earlier stage frequency converter 17 may be suspended to receive a television broadcast signal, for example, and the television signal is demodulated by demodulation means 41, as illustrated in FIG. 3A, and the demodulated picture may be displayed on the monitor processing means 44. Alternatively, only the frequency of the local signal associated with the later stage frequency converter 22 may be swept to examine the spectrum of the television signal before it is demodulated.

A specific application of the invention to the determination of a television signal, as exemplified above, will be described in more detail. In FIG. 2, suppose that I.F. bandpass filter 19 has a passband center frequency IF1 of 400 MHz, I.F. bandpass filter 24 has a passband center frequency IF2 of 40 MHz, and the input signal to be determined (which is a television signal in the present example) has a video carrier frequency of 199.25 MHz, an aural carrier frequency of 203.76 MHz and a channel bandwidth of 6 MHz. A maximum determination span is determined by the passband width of the I.F. bandpass filter 19, and accordingly, in order to determine the frequency band for one channel of the television signal in one sweep, it is necessary that the passband of the filter includes a flat frequency response portion which is as wide as or greater than the bandwidth of 6 MHz for one channel of the television signal.

To extract the television signal as the input signal, the oscillation frequency of the local oscillator 18 is fixed to 601 MHz. Thus the video carrier frequency will be equal to 401.75 MHz and the aural carrier frequency will be equal to 397.25 MHz in the output from the amplifier 21. The oscillation frequency of the local oscillator 43 is fixed to 343 MHz so that the input signal to the demodulation means 41 presents a standard intermediate frequency in Japan for television receivers, namely, 58.75 MHz for picture intermediate frequency and 54.25 MHz for aural intermediate frequency.

A demodulator in a usual television receiver is used as demodulation means 41 to demodulate a picture signal and a sync signal, which are fed to a television monitor, forming part of the monitor processing means 44, whereby the input television signal is displayed as a picture for viewing.

At the same time, the oscillation frequency of the local oscillator 23 is swept across 360 MHz±3 MHz. This allows the display 35 to display a spectrum waveform of the input television signal. In this manner, it is possible to observe the spectrum waveform of the input television signal and the television picture simultaneously. It is also possible to have the spectrum waveform displayed in one-half and the television picture displayed in the other half of display area of the display 35.

Figure 3B:
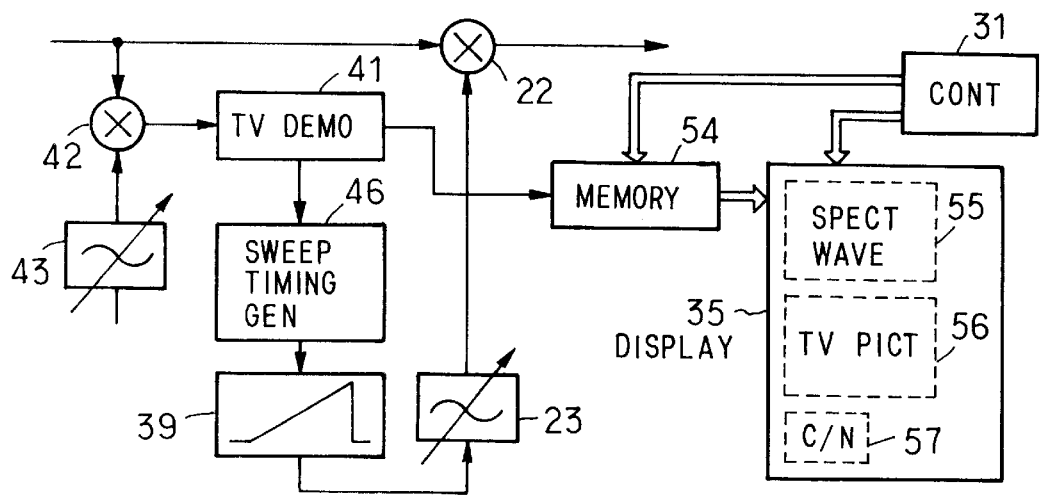
Figure 4:
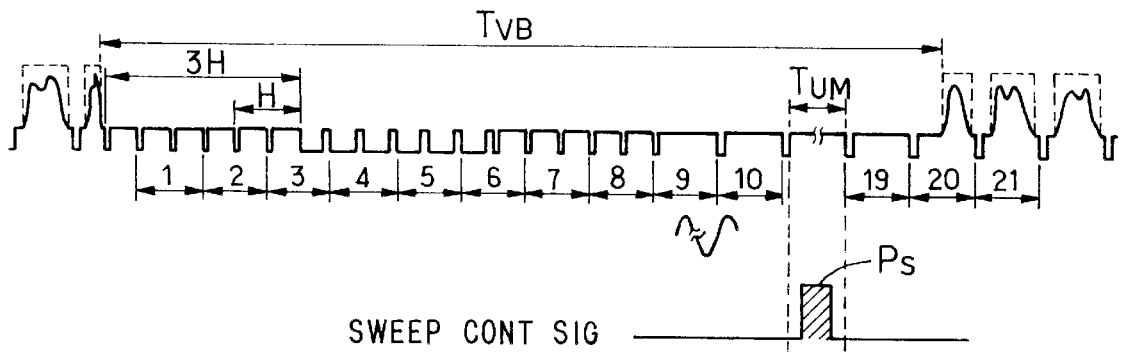
FIG. 4 graphically illustrates an exemplary relationship between a television signal waveform and a gate sweep pulse Ps during a no-modulation interval thereof.
Figure 5:
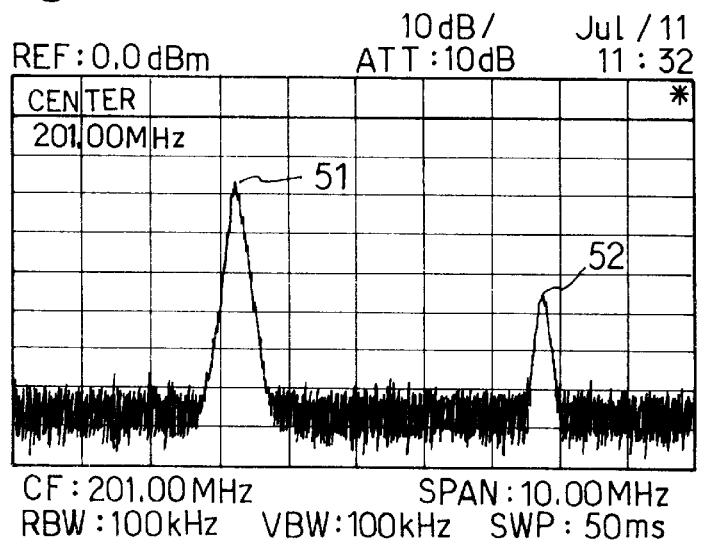
FIG. 5 graphically illustrates an example of spectral waveform for during a modulation interval and FIG. 6 graphically illustrates an example of spectral waveform for television signal.
Figure 6:
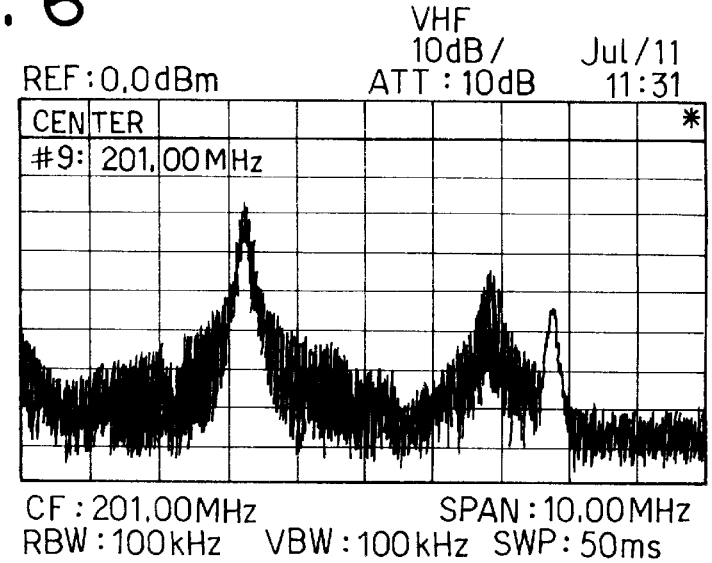

As partly shown in FIG. 3B, the sync signal demodulated from the television demodulator 41 may be fed to a sweep timing generator 46, which generates a sweep control pulse Ps in a portion of a no-modulation interval $T_{UM}$ (one horizontal scan period) contained in a vertical blanking interval $T_{VB}$ of the television picture signal, as indicated in FIG. 4. The sweep control pulse Ps is fed to the ramp voltage generator 39, causing a gate sweep, or a frequency sweep of the local oscillator 23 for the interval of the sweep control pulse Ps, to allow a spectrum waveform for noises contained in the band of the input television signal to be displayed on the display 35, without being influenced by the picture signal (or modulating component). In this manner, a spectrum waveform as illustrated in FIG. 5 can be observed. Referring to this Figure, a peak 51 shown on the left hand indicates a picture carrier component while a peak 52 shown on the right hand indicates an aural carrier component. It is to be noted that a spectrum waveform over the band of the television signal inclusive of the picture modulation will be as illustrated in FIG. 6 where it is to be noted that a determination of noises over the band of the input television signal is prevented by the AM modulation of the picture carrier signal.

An in-band noise level N may be determined from the noise spectrum waveform shown in FIG. 5 and used with a maximum value C of the peak in the carrier component 51 to calculate C/N by the controller 31, with C/N being displayed on the display 35. As shown in FIG. 3B, an output from the television demodulator 41 may be stored as a digital signal in a memory 54, and the controller 31 can cause a spectrum waveform display 55, a television picture display 56 and a C/N display 57 to be provided on a display screen of the display 35. Displaying a plurality of items such as picture, waveform and numerical figures on a single display such as display 35 is known in the art of digital spectrum analyzer. The noise level N may denote a total sum of noise levels within a band, or a mean level over arbitrarily chosen frequencies which is converted into a noise level at 4.5 MHz.

During the determination of the C/N figure of the television signal, the C value can be obtained as the maximum peak value in the picture carrier signal modulated by the picture signal or in the television signal, but the in-band noise of the television signal cannot be determined because it cannot be distinguished from the modulation signal components. Accordingly, in the prior art practice, a determination of the noises is made while suppressing the modulation, or alternatively, noises outside the band of the television signal are determined and used as in-band noises. However, with the embodiment described above, the in-band noise N of the television signal can be determined during the no-modulation interval $T_{UM}$, and the maximum peak value C of the picture carrier signal can also be determined.

Figure 3C:
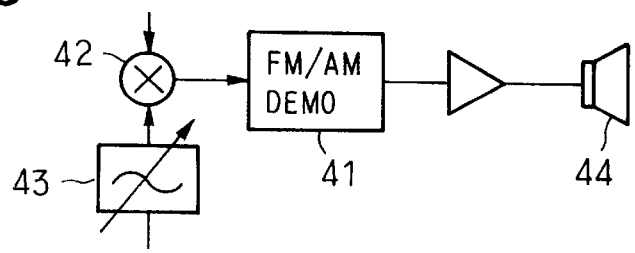

Referring to FIG. 2, the frequency of the local signal supplied to the earlier stage frequency converter 17 may be held fixed while receiving an FM/AM broadcast signal, which may be subject to an FM/AM demodulation by demodulation means 41, as shown in FIG. 3C, to feed a loudspeaker, thus providing an auditory monitoring. In this instance again, the frequency of the local signal supplied to the later stage frequency converter 22 may be swept to perform an analysis in the frequency domain.

Figure 3D:
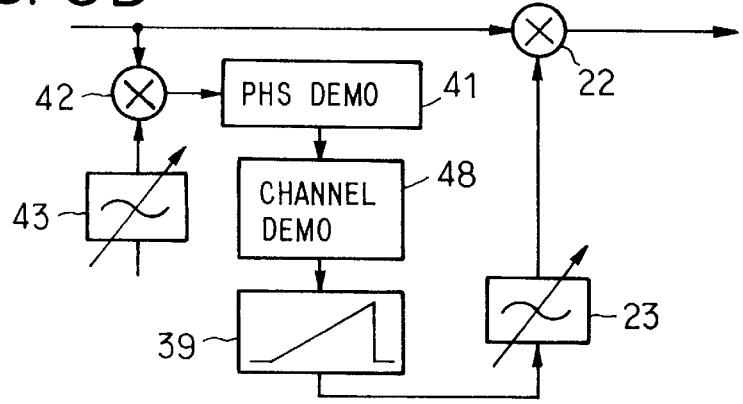

As an alternative, a time division multiplex signal, such as a PHS radio wave may be received and its time division frame detected by demodulation means 41, as shown in FIG. 3D. A particular channel or time slot in the frame may be detected by a channel detector 48, which then activates the ramp voltage generator 39 to generate a sweep signal only for the duration of that channel or time slot, serving as a gate sweep signal to perform a gate sweep of the frequency of the local signal of the local signal generator 23. In this manner, an analysis of frequency components contained in the particular channel (or time slot) in the radio wave being received is enabled.

As discussed above, the invention permits an analysis in the frequency domain, and also permits an analysis in the time domain simultaneously. In addition, a variety of radio waves may be received including radio wave from a television broadcast in service and radio wave from mobile communication to conduct C/N determination or modulation response determination.

What is claimed is:

1. A spectrum analyzer comprising:

at least two stages of frequency converters wherein a frequency of a local oscillation signal supplied to a later stage frequency converter is swept while a frequency sweep of a local oscillation signal supplied to an earlier stage frequency converter is fixed to determine a frequency of an input signal to be measured;

branch means for branching an output signal from the earlier stage frequency converter at a point prior to the later stage frequency converter; and demodulation means for demodulating the signal from the earlier stage frequency converter which is branched by the branch means;

whereby a demodulated output signal from the demodulation means is monitored in a time domain while a frequency spectrum of said input signal is displayed in a frequency domain simultaneously .

2. The spectrum analyzer according to claim 1, further comprising monitor means, receiving the demodulated output signal from the demodulation means, for monitoring the demodulated output signal.

3. A spectrum analyzer comprising:

at least two stages of frequency converters wherein a frequency of a local oscillation signal supplied to a later stage frequency converter is swept while a frequency sweep of a local oscillation signal supplied to an earlier stage frequency converter is fixed to determine a frequency of an input signal to be measured;

branch means for branching an output signal from the earlier stage frequency converter at a point prior to the later stage frequency converter;

demodulation means for demodulating the signal from the earlier stage frequency converter which is branched by the branch means, wherein the input signal is a television signal and the demodulation means is means for demodulating a picture signal as well as a sync signal;

sweep control pulse generating means responsive to the sync signal demodulated by the demodulation means for generating a sweep control pulse during a no-modulation interval contained in a vertical blanking interval of the television signal;

means responsive to the sweep control pulse for generating a ramp voltage causing the frequency of the local oscillation signal supplied to the later stage frequency converter to be swept during the duration of the sweep control pulse so that components in the frequency band of the television signal may be extracted from the later stage frequency converter; and display means having a display panel for displaying the demodulated picture signal from the demodulation means in a time domain as well as a frequency spectrum of said input signal based on the thus extracted components in a frequency domain on the same display panel and simultaneously.

4. A spectrum analyzer according to claim 3, in which a converted output from the earlier stage frequency converter is extracted therefrom by a bandpass filter having a passband which exhibits a flat frequency response over at least the frequency bandwidth of the television signal.

5. A spectrum analyzer according to claim 4, further comprising means for determining a noise level N obtained during the duration of the sweep control pulse and a level C of a picture carrier signal of the television signal and for calculating C/N, and said displaying means displaying the thus calculated C/N.

6. A spectrum analyzer comprising:

at least two stages of frequency converters wherein a frequency of a local oscillation signal supplied to a later stage frequency converter is swept while a frequency sweep of a local oscillation signal supplied to an earlier stage frequency converter is fixed to determine a frequency of an input signal to be measured;

branch means for branching an output signal from the earlier stage frequency converter at a point prior to the later stage frequency converter;

demodulation means for demodulating the signal from the earlier stage frequency converter which is branched by the branch means; wherein the input signal is a time division multiplex signal and the demodulation means is means for demodulating each time slot signal in the time division multiplex signal;

channel detecting means for generating a sweep control pulse for the interval of one time slot from the demodulation means;

means responsive to the sweep control pulse for generating a ramp voltage causing the frequency of the local oscillation signal supplied to the later stage frequency converter to be swept during the duration of the control pulse so that components in the frequency band of the time division multiplex signal may be extracted from the later stage frequency converter; and display means for displaying a frequency spectrum of said time division multiplex signal based on the components in a frequency domain.

7. A spectrum analyzer comprising:

an earlier stage frequency converter wherein an input signal to be measure is mixed with a first local oscillation signal generated by a first local oscillator so that a first intermediate frequency signal is extracted;

a controller controlling said earlier stage frequency converter such that a frequency sweep of the first local oscillation signal supplied to said earlier stage frequency converter is fixed to tune to a frequency of an input signal to be measured;

a later stage frequency converter supplied with the first intermediate frequency signal from said first stage frequency converter, wherein a frequency of a second local oscillation signal generated by a second local oscillator and supplied to the later stage frequency converter is swept, and the first intermediate frequency signal is mixed with said second local oscillation signal so that a second intermediate frequency signal is extracted;

processing means for processing an output signal from said later stage frequency converter to obtain data of a frequency component of the signal under processing;

branch means for branching an output signal from the earlier stage frequency converter at a point prior to the later stage frequency converter;

demodulation means for effecting demodulation on the signal from the earlier stage frequency converter which is branched by the branch means;

control means responsive to said demodulation means for controlling generation of the local oscillation signal supplied to the later stage frequency converter; and display means for displaying a frequency spectrum of said input signal in a frequency domain from the data of the processing means and monitoring an output signal from the demodulation means in a time domain simultaneously.

8. A spectrum analyzer according to claim 7, further comprising monitor means for monitoring the demodulated signal supplied from the demodulation means.

9. A spectrum analyzer according to claim 7, in which the input signal is a television signal and the demodulation means is means for demodulating a picture signal and a sync signal, further comprising:

sweep control pulse generating means which receives the sync signal demodulated by the demodulation means for generating a sweep control pulse during a no-modulation interval contained in a vertical blanking interval of the television signal; and means responsive to the sweep control pulse for generating a ramp voltage causing the frequency of the second local oscillation signal supplied to the later stage frequency converter to be swept during the duration of the control pulse so that a component in the frequency band-width of the television signal may be extracted from the later stage frequency converter.

10. A spectrum analyzer according to claim 9, further comprising a band-pass filter disposed between said earlier and later stage frequency converters and extracting the first intermediate frequency signal, said band-pass filter having a pass band-width and a flat frequency response characteristic over at least the frequency band-width of the television signal.

11. A spectrum analyzer according to claim 10, further comprising means for determining a noise level N obtained during the duration of the sweep control pulse and a level C of a picture carrier signal and for calculating C/N and said display means displaying the thus calculated C/N.

12. A spectrum analyzer according to claim 7, in which the input signal is a time division multiplex signal such as PHS radio wave and the demodulation means is means for demodulating each time slot signal in the time division multiplex signal, further comprising channel detecting means for generating a sweep timing pulse for the interval of one time slot from the demodulation means, and means responsive to the sweep timing pulse for generating a ramp voltage causing the frequency of the local oscillation signal supplied to the later stage frequency converter to be swept during the duration of the pulse so that a component in the frequency band-width of the time division multiplex signal may be extracted from the later stage frequency converter.

13. A spectrum analyzer comprising:

a first frequency converter converting an input carrier signal to be measured which has been modulated by an input modulation signal into a first intermediate frequency signal by mixing with a first local oscillation signal generated by a first frequency sweep oscillator;

a controller controlling said first frequency sweep oscillator such that a frequency of said first local signal is held suspended to such a fixed frequency as to tune the first frequency converter to the input carrier signal;

a second frequency converter converting the first intermediate frequency signal into a second intermediate frequency signal by mixing with a second local oscillation signal generated by a second frequency sweep oscillator;

said controller further controlling said second frequency sweep oscillator such that said second local oscillation signal is swept with a swept frequency range, processing means for processing the second intermediate frequency signal to obtain a component data of the input carrier signal within the swept frequency range;

display means for displaying a frequency spectrum in a frequency domain based on the data from the processing means;

demodulation means for effecting demodulation on the first intermediate frequency signal which is supplied thereto from a point prior to input of the second frequency converter thereby to obtain a demodulated signal representing the input modulation signal; and whereby said demodulated signal from said demodulation means is displayed by said monitor means in a time domain as well as the frequency spectrum of the input carrier signal in a frequency domain simultaneously.

14. A spectrum analyzer according to claim 13, wherein said monitor means is incorporated in said display means.

15. A spectrum analyzer according to claim 13, in which the input signal is a television signal and the demodulation means is means for demodulating a picture signal and a sync signal, further comprising:

sweep timing generating means which receives said sync signal for generating a sweep control pulse during a no-modulation interval contained in a vertical blanking interval of the television signal; and means responsive to the sweep control pulse for generating said ramp voltage causing the frequency of the second local oscillation signal supplied to the second frequency converter to be swept during the duration of the control pulse so that noise spectrum components contained in the frequency band-width of the television signal may be extracted from the second frequency converter.

\* \* \* \* \*